United States Patent [19]
Rhee

[11] Patent Number: 6,064,272
[45] Date of Patent: May 16, 2000

[54] PHASE INTERPOLATED FRACTIONAL-N FREQUENCY SYNTHESIZER WITH ON-CHIP TUNING

[75] Inventor: Woogeun Rhee, Irvine, Calif.

[73] Assignee: Conexant Systems, Inc., Newport Beach, Calif.

[21] Appl. No.: 09/108,947

[22] Filed: Jul. 1, 1998

[51] Int. Cl.[7] .......................... H03L 7/081; H03L 7/087; H03L 7/18
[52] U.S. Cl. ................ 331/16; 331/10; 331/18; 331/1 A; 327/158; 455/260
[58] Field of Search .............. 331/1 A, 10, 16, 331/18, 25; 327/105, 156–159; 455/260

[56] References Cited

U.S. PATENT DOCUMENTS

| | | |
|---|---|---|
| 4,679,005 | 7/1987 | Tatami . |
| 4,686,488 | 8/1987 | Attenborough ............................. 331/2 |
| 4,817,199 | 3/1989 | Wallraff .................................. 455/260 |
| 4,922,141 | 5/1990 | Lofgren et al. . |
| 5,349,613 | 9/1994 | Dijkhof .................................... 325/120 |
| 5,373,259 | 12/1994 | Hackman et al. .................... 331/36 C |
| 5,727,037 | 3/1998 | Maneatis ................................. 375/376 |
| 5,740,213 | 4/1998 | Dreyer .................................... 375/374 |
| 5,751,194 | 5/1998 | Haapanen et al. ....................... 331/17 |
| 5,907,253 | 5/1999 | Davis et al. . |

FOREIGN PATENT DOCUMENTS

| | | |
|---|---|---|
| 0655840A2 | 5/1995 | European Pat. Off. . |
| 2107142A | 4/1983 | United Kingdom . |

OTHER PUBLICATIONS

Phillips Semiconductors Product Specification "1.8 GHz low–voltage Fractional–N synthesizer," Oct. 15, 1996, 21 pages.

National Semiconductor Advance Information "LMX2350/LMX2352 PLLatinum™ Fractional N RF / Integer N IF Dual Low Power Frequency Synthesizer," Feb. 1998, 18 pages.

Byrd et al., "A Fast Locking Scheme for PLL Frequency Synthesizers," National Semiconductor Corporation, Jul. 1995, 6 pages.

http://www.kabuki.eecs.berkeley.edu/rfl, "A Phase Interpolation Technique for Fractional–N Frequency Synthesis: Slides 3–21" Oct. 2, 1995, 18 pages.

Craninckx et al., "A 1.75–GHz/3–V Dual Modulus Divide–by–128/129 Prescaler in 0.7–$\mu$m CMOS," *IEEE Journal of Solid–State Circuits*, vol. 31, No. 7, Jul. 1996, pp. 890–897.

Egan, W., Section 7.3, "The Digiphase® Synthesizer," Frequency Synthesis by Phase Lock, 1990, pp. 196–203.

*Primary Examiner*—David Mis
*Attorney, Agent, or Firm*—Knobbe, Martens, Olson & Bear, LLP

[57] ABSTRACT

A phase interpolated frequency synthesizer with on chip tuning includes a voltage controlled oscillator, a fractional-N divider, phase compensation and on chip tuning circuits, a phase detector, and a loop filter. The phase compensation and on chip tuning circuits compensate for the phase lag from the fractional-N divider. The phase compensation circuit can include a series of voltage controlled delay elements with the tuning circuit providing a control voltage.

15 Claims, 7 Drawing Sheets

PHASE INTERPOLATED FRACTIONAL-N FREQUENCY SYNTHESIZER WITH ON-CHIP TUNING

BACKGROUND OF THE INVENTION

1. Field of the Invention

The invention relates generally to phase locked loops (PLLs). Embodiments of the invention relate to PLLs useful in synthesizing frequencies including fractional-N synthesizers.

2. Description of the Related Art

PLLs are commonly used to produce a precise, stable frequency. The basic elements of a PLL include a reference frequency source, a voltage controlled oscillator (VCO), a frequency divider, a phase detector and a loop filter. The output of the VCO is applied to the frequency divider and the output of the frequency divider is applied to the phase detector. The reference frequency is applied as the other input of the phase detector. The phase detector output is proportional to the difference in phase between the two input signals. The output of the phase detector is applied to the loop filter and the output of the loop filter is the input of the VCO.

Figure 1A:
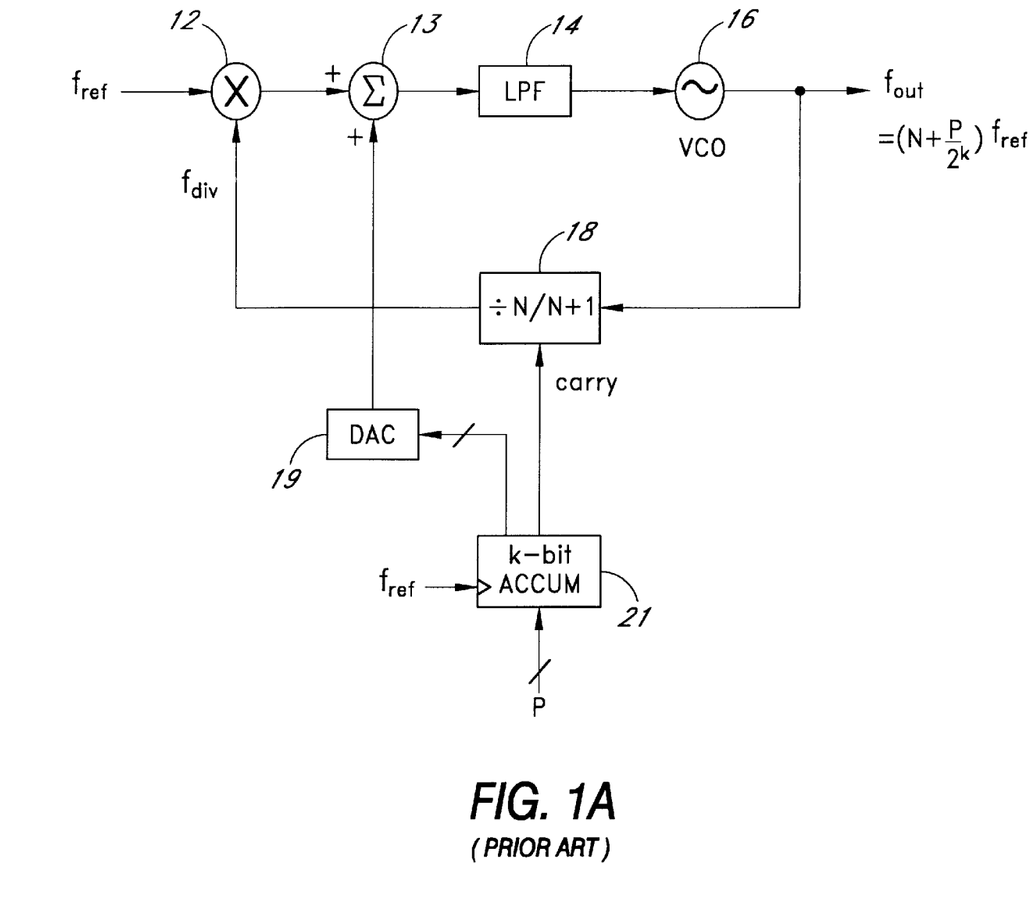
FIG. 1A is a block diagram of a conventional fractional-N synthesizer.

One type of PLL is referred to as a fractional-N loop or synthesizer. See, e.g., *Phase-Locked Loops*, Best, Roland E., McGraw-Hill Book Company, 1984, p. 227–229. In a fractional-N synthesizer, the output frequency ($f_{out}$) is equal to N.F ($f_{ref}$), where N is the integer part and F is the fractional part. A block diagram of a fractional-N syntnesizer is shown in FIG. 1A. This synthesizer includes the basic PLL elements of a VCO 16, a frequency divider (divide N/N+1) 18, which in this case is programmable, and a phase detector 12. This synthesizer also includes an accumulator 21, a digital to analog converter 19 and a summing circuit 13.

The reference frequency ($f_{ref}$) is applied to one input of the phase detector 12. The output of the divider 18 is applied to the other input of the phase detector 12. The accumulator 21 receives $f_{ref}$ as its clocking signal and provides a carry or overflow signal to the divider 18. The carry signal causes the divider 18 to switch from divide by N to divide by N+1. The output of the accumulator 21 is provided to the digital to analog converter 19. The digital to analog converter 19 converts the input to an analog signal which is provided as an input to the summing circuit 13. The other input of the summing circuit 13 is the output of the phase detector 12. The output of the summing circuit 13, the sum of the two input signals, is provided to the loop filter 14. The output of the loop filter 14 is provided to the VCO 16. The output of the VCO 16 is applied to the divider 18.

This circuit is capable of synthesizing frequencies which are a fractional multiple of the reference frequency ($f_{ref}$). For example, if a division ratio of 4.25 is desired, that can be accomplished by the fractional-N divider 18 dividing by 4 in 3 cycles of each group of 4 cycles (modulo 4) and dividing by 5 in the remaining cycle, wherein a "cycle" is one period of $f_{ref}$. Therefore, over 4 cycles, $f_{out}=4.25$ ($f_{ref}$).

Figure 1B:
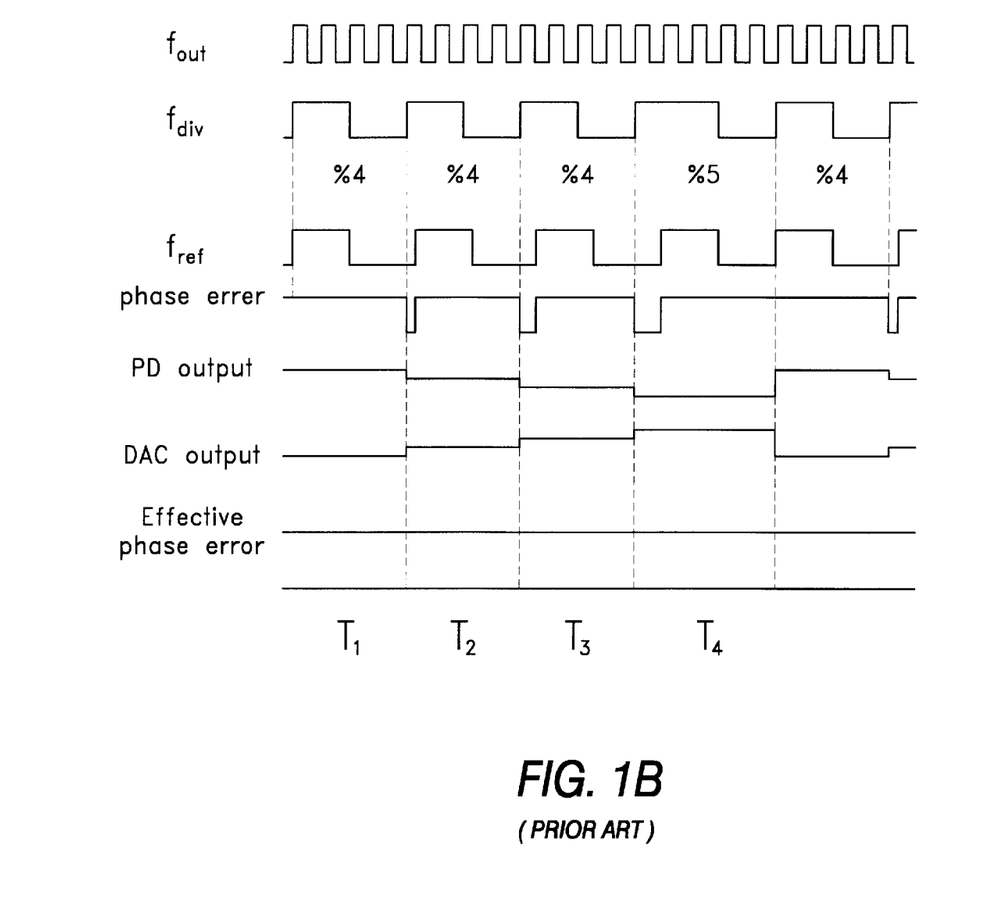
FIG. 1B is a timing diagram showing the relationship between selected signals of the fractional-N synthesizer of FIG. 1A.

FIG. 1B is a timing diagram of selected signals of the conventional fractional-N synthesizer circuit shown in FIG. 1A with regard to the specific example, wherein $f_{out}=4.25$ $f_{ref}$. We begin in the state where the output frequency $f_{out}$ is already 4.25 times $f_{ref}$. The divider 18 has been programmed for N=4. The accumulator 21 has been programmed to generate a "carry" signal at every fourth cycle. During the time intervals $T_1$–$T_4$, $f_{out}$, has 17 cycles and $f_{ref}$ has 4 cycles. Each time interval T equals one period of $f_{ref}$. During the time interval $T_1$, the fractional-N divider 18 divides the signal $f_{out}$ by 4. In the second time period $T_2$ and third time period $T_3$, the divider 18 again divides the signal $f_{out}$ by 4. At the beginning of the fourth time period, $T_4$, the accumulator generates the carry signal which causes the divider to divide by N+1, in this example N+1=5. Therefore, the signal $f_{out}$ is divided by five during $T_4$. As can be seen in FIG. 1B, the phase detector 12 detects a negative phase error in time periods $T_2$, $T_3$ and $T_4$ and generates a corresponding output. However, that output is canceled by the output of the digital to analog converter 19 which converts the output of the accumulator 21 to an analog signal which is equal and opposite to the output of the phase detector 12. The output signal of the digital to analog converter 19 is combined with the output of the phase detector 12 by the summing circuit 13 and the two signals effectively cancel each other.

A conventional fractional-N synthesizing, such as shown in FIG. 1A, call provide an effective method for reducing spurs when combined with a sample and hold phase detector. However, that approach has been found not to be effective or efficient when used with phase/frequency detectors and charge pump PLLs. Therefore, there is a need for a method and apparatus for reducing spurs that can be effectively and efficiently used with phase/frequency detectors in charge pump PLLs.

SUMMARY OF THE INVENTION

One embodiment of the invention is in the form of a phase locked loop configured as a phase interpolated fractional-N frequency synthesizer with on chip tuning which can be used for synthesizing frequencies while reducing spur. The phase locked loop includes a controlled oscillator having an output controlled by an input voltage. A frequency divider receives the output of the controlled oscillator and provides a frequency divided output signal. A phase compensator receives the frequency divided output from the frequency divider and provides an output which compensates for the phase lag of the frequency divided output of the frequency divider. A phase detector receives the output of the phase compensator and a reference frequency and outputs a signal proportional to the difference in phase between the two inputs. A loop filter receives the output of the phase detector and generates an output which drives or controls the voltage controlled oscillator.

In another aspect of the invention, the phase compensator includes a phase compensation and an on chip tuning circuit. The phase compensation circuit provides a plurality of output signals of different delays. The on chip tuning portion, which can be in the form of a delay locked loop, generates a control voltage for controlling the delays of the phase compensation circuit. In one embodiment, the delays are implemented by delay lines including voltage controlled delay elements.

Another aspect of the invention is directed to a method for synthesizing a frequency using a phase locked loop. The method involves generating an output signal, frequency dividing the output signal by at least two integer values to generate, over a discrete time period, a fractional-N divided signal, and generating a variably delayed signal based upon the fractional-N divided signal which compensates for phase delays of said fractional-N divided signal within said discrete time period.

BRIEF DESCRIPTION OF THE DRAWINGS

The features and advantages of the present invention become more apparent from the detailed description set forth below when taken in conjunction with the drawings, wherein.

DETAILED DESCRIPTION OF THE PREFERRED EMBODIMENT

The invention will be described in terms of exemplary embodiments adapted to synthesize selected frequencies while minimizing signal spurs. However, it will be clear to those skilled in the art that the invention can be utilized in various applications including many forms of communication systems.

Figure 2:
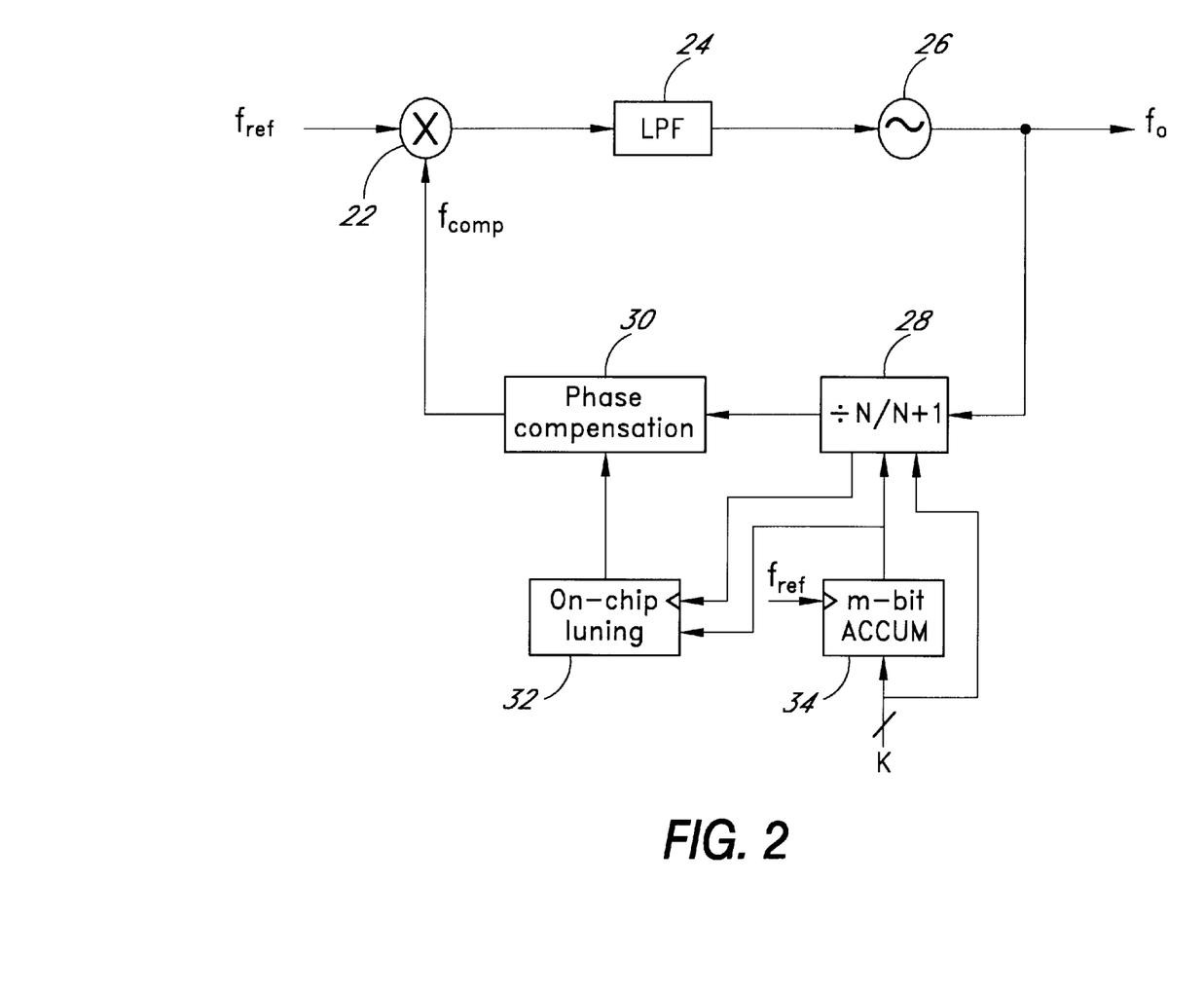
FIG. 2 is a block diagram of an embodiment of a phase interpolated fractional-N frequency synthesizer with on chip tuning according to the principles of the present invention.

FIG. 2 is a block diagram of a phase interpolated fractional-N frequency synthesizer which represents an embodiment of the present invention. The synthesizer is generally indicated as 20. The synthesizer 20 can be implemented as an integrated circuit using known CMOS fabrication methods or other compatible semiconductor chip technology. A reference frequency ($f_{ref}$) is provided to an input of a phase detector 22. The reference frequency can be provided, for example, by an oscillator such as a crystal oscillator (not shown). The output of the phase detector 22 is provided to a loop filter 24. The output of the loop filter 24 is provided to a controlled oscillator 26, such as a VCO, which has an output $f_o$ which is the output of the synthesizer 20. The signal $f_o$ is supplied to a fractional-N divider 28. A control word K is supplied to the fractional-N divider 28 in order to set the value of the divisor N.

The output of the fractional-N divider 28 is provided to a phase compensation circuit 30 and to an on chip tuning circuit 32, which in combination are referred to as a phase compensator. The output ($f_{comp}$, the feedback signal) from the phase compensation circuit 30 is provided as the second input to the phase detector 22. An accumulator 34 also receives control word K and the signal $f_{ref}$. The carry out port (the carry signal) from the accumulator also serves as an input to the fractional-N divider 28. The signal $f_{ref}$ serves as the clocking signal for the accumulator. The signal from a carry out port 35 of the accumulator 34 triggers the divide by N+1 function of the fractional-N divider.

The phase detector 22, loop filter 24 and VCO 26 may be of any suitable type known to those of ordinary skill. One particular phase detector is described in patent application Ser. No. 09/108,459 entitled Method and Apparatus for Adjusting Phase Offset in a Phase Locked Loop, filed the same day as the present application and assigned to the assignee of the present application, which application is incorporated by reference herein. For example, the types of phase detectors, loop filters, VCOs and fractional-N dividers commonly used in fractional-N synthesizers can be used for the synthesizer 20, such as voltage or current controlled oscillators, phase or phase/frequency detectors, active or passive loop filters and loop filters with charge pumps.

Figure 3:
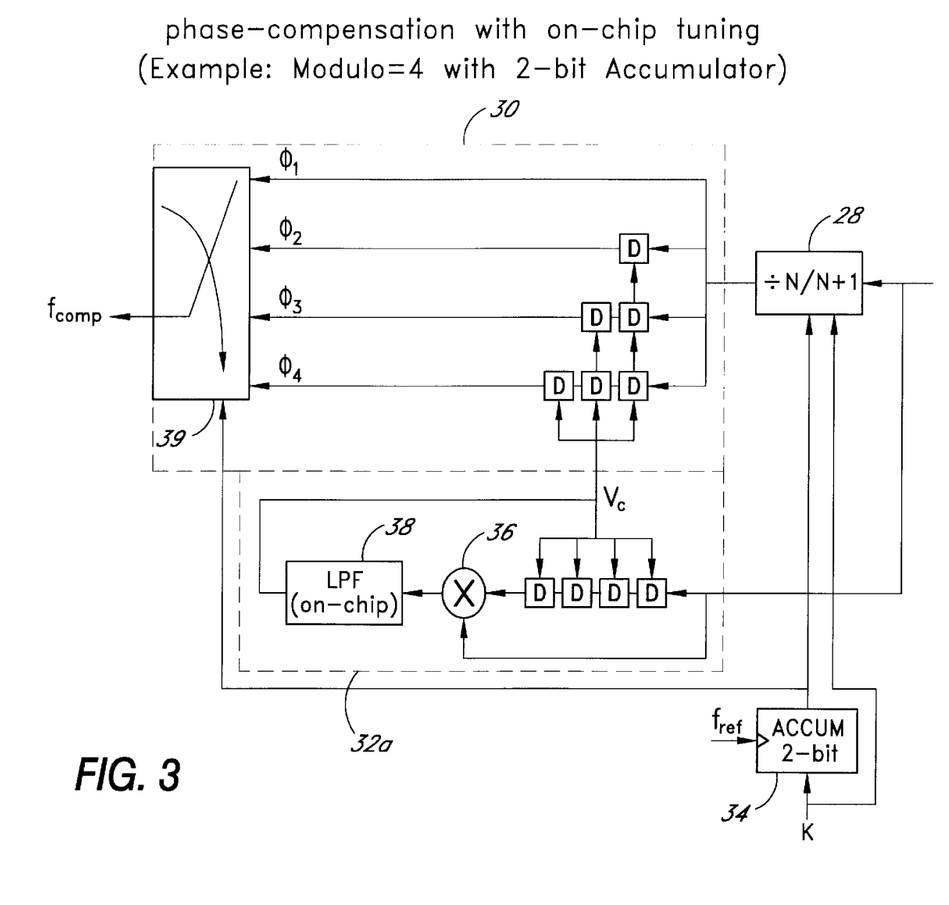
FIG. 3 is a block diagram of an embodiment of the phase compensation circuit and on chip tuning circuits according to the principles of the present invention.

FIG. 3 depicts a more detailed diagram of an embodiment of the phase compensation circuit 30 and on chip tuning circuit 32 of FIG. 2. As illustrated in FIG. 3, the phase compensation circuit 30 and the on chip tuning circuit 32 may be implemented using an arrangement of voltage controlled delay elements (D) where the amount of delay is controlled by the control signal. In the present example, each of the delay elements D provides a signal delay of $T_{vco}/4$, where $T_{vco}$ equals the period of the frequency of the output of the VCO 26 also referred to as $f_o$.

The output of the fractional-N divider 28 is applied to the series of delay lines whose outputs are identified as $\phi_1$–$\phi_4$. $\phi_1$ has no delay elements, $\phi_2$ has a single delay element, $\phi_3$ has two delay elements and $\phi_4$ has three delay elements. The signals $\phi_1$–$\phi_4$ are provided to control circuitry 39 which has an output signal $f_{comp}$ which is applied to an input of the phase detector 22 (see FIG. 2). The output $f_{comp}$ of control circuitry 39 is selectively switched among the inputs $\phi_1$–$\phi_4$ according to the output of the accumulator 34 which is provided to the control circuit 39.

As shown in FIG. 3, the on chip tuning circuit 32 includes four voltage control delay elements D, a phase detector 36 and a loop filter 38. In the embodiment depicted in FIG. 3, the on chip tuning circuit 32 is implemented as a delay locked loop. The signal $f_o$, the output of the VCO, passes through the four delay elements (D) of the on chip tuning circuit 32 and is then provided to the phase detector 36. In addition, $f_o$, (not delayed) is also applied to the phase detector 36. The phase detector 36 outputs a signal proportional to the difference in phase between the two input signals. The output of the phase detector 36 then passes through a loop filter 38. The output $V_c$ of the loop filter 38 is used as the control voltage for each of the delay elements (D) of the on chip tuning circuit 32. In addition, that control voltage $V_c$ is also applied to each of the delay elements D in the phase compensation circuit 30. The delay of each delay element (D) of the tuning circuit 32 is ¼ the period of the frequency of the input signal to the delay locked loop. In this way, the timing circuit 32 determines or adjusts the value of the delay elements according to the input frequency.

Figure 4:
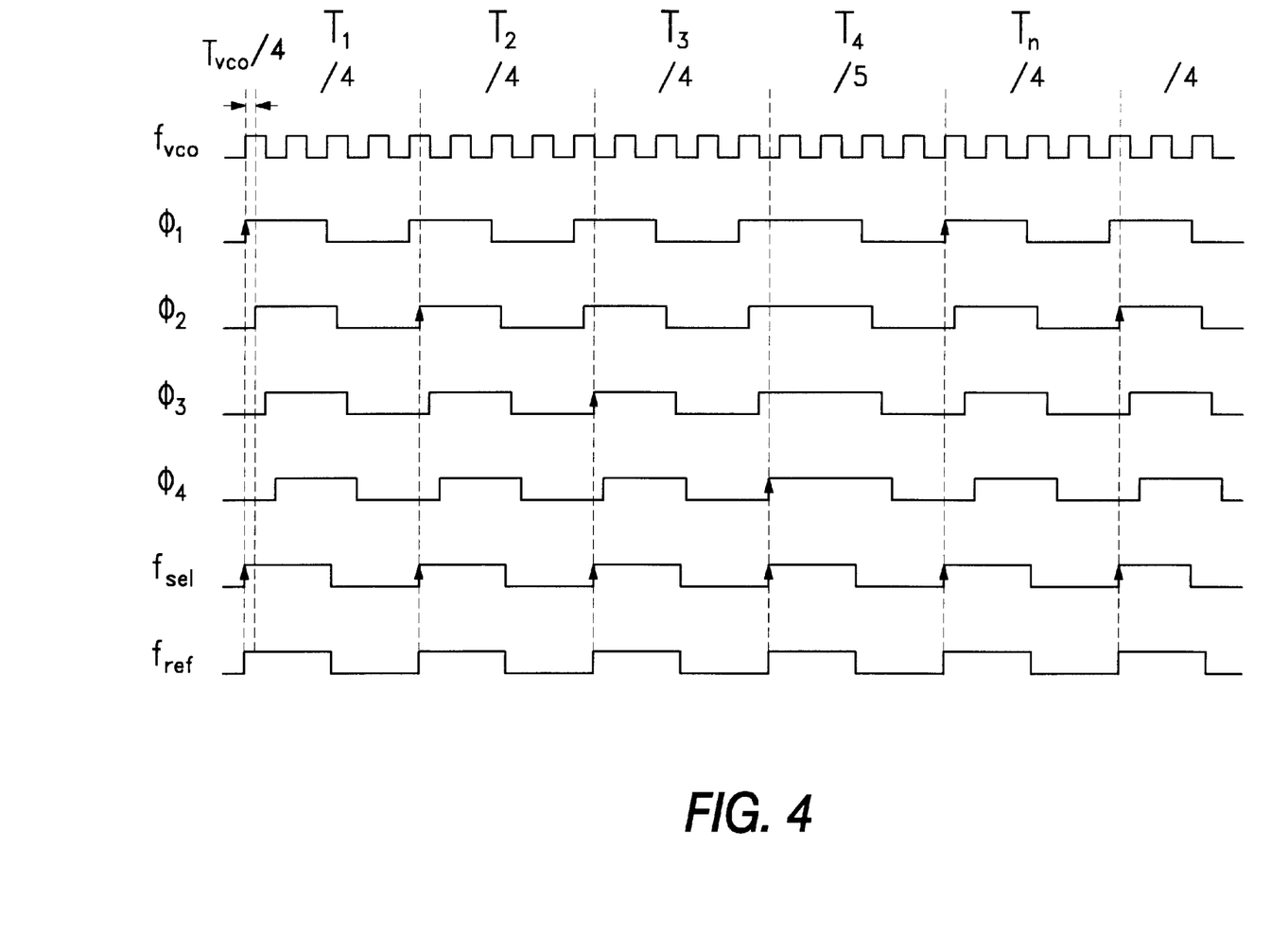
FIG. 4 is a timing diagram illustrating the relationship between various signals of the synthesizer depicted in FIG. 2.

The timing diagram shown in FIG. 4 illustrates the relationship between various signals of the synthesizer shown in FIG. 2 and the embodiment of the phase compensation circuit and on chip tuning circuit depicted in FIG. 3. Specifically, the timing diagram in FIG. 4 represents the example where $f_o$=4.25 ($f_{ref}$).

We begin in the state where the output frequency $f_o$ is already 4.25 times ($f_{ref}$). The divider 28 is programmed for N=4 (via control word K). The accumulator 34 is programmed (via control word K) to generate a carry signal at every fourth cycle of $f_{ref}$. Each time interval T is equal to one cycle of $f_{ref}$. During the time intervals $T_4$–$T_4$, $f_o$ has 17 cycles and $f_{ref}$ has 4 cycles. During the time interval $T_1$, the fractional-N divider 28 divides the signal $f_o$ by 4. In the second time period $T_2$ and the third time period $T_3$ the divider 28 again divides the signal $f_o$ by 4. At the beginning of the fourth time period, $T_4$, the accumulator 34 generates the carry signal which causes the divider to divide by N+1, in this example N+1=5. Therefore, signal $f_o$ is divided by five during $T_4$.

During the time period $T_1$, the phase compensation circuit 30, more specifically, control circuit 39 (FIG. 3), provides the signal $\phi_1$ to the phase detector 22 (FIG. 2). Note that at the beginning of the time period $T_1$, signal $\phi_1$ is in phase with the signal $f_{ref}$. At the beginning of the time period $T_2$, the output of the phase compensation circuit 30 switches to $\phi_2$. Recall that the switching of the output of the control circuit 39 is controlled by the output of the accumulator 34 which is clocked by the signal $f_{ref}$ (see FIG. 3). Again, note that $\phi_2$ is in phase with $f_{ref}$ at the beginning of the time period $T_2$. Similarly, at the beginning of the time period $T_3$, the output of the phase compensation circuit 30 switches to $\phi_3$ and then at the beginning of the time period $T_4$, the output of the phase compensation circuit 30 switches to $\phi_4$. The pattern then repeats. In that way, compensation for the phase lag of the divider 28 is accomplished.

Figure 5:
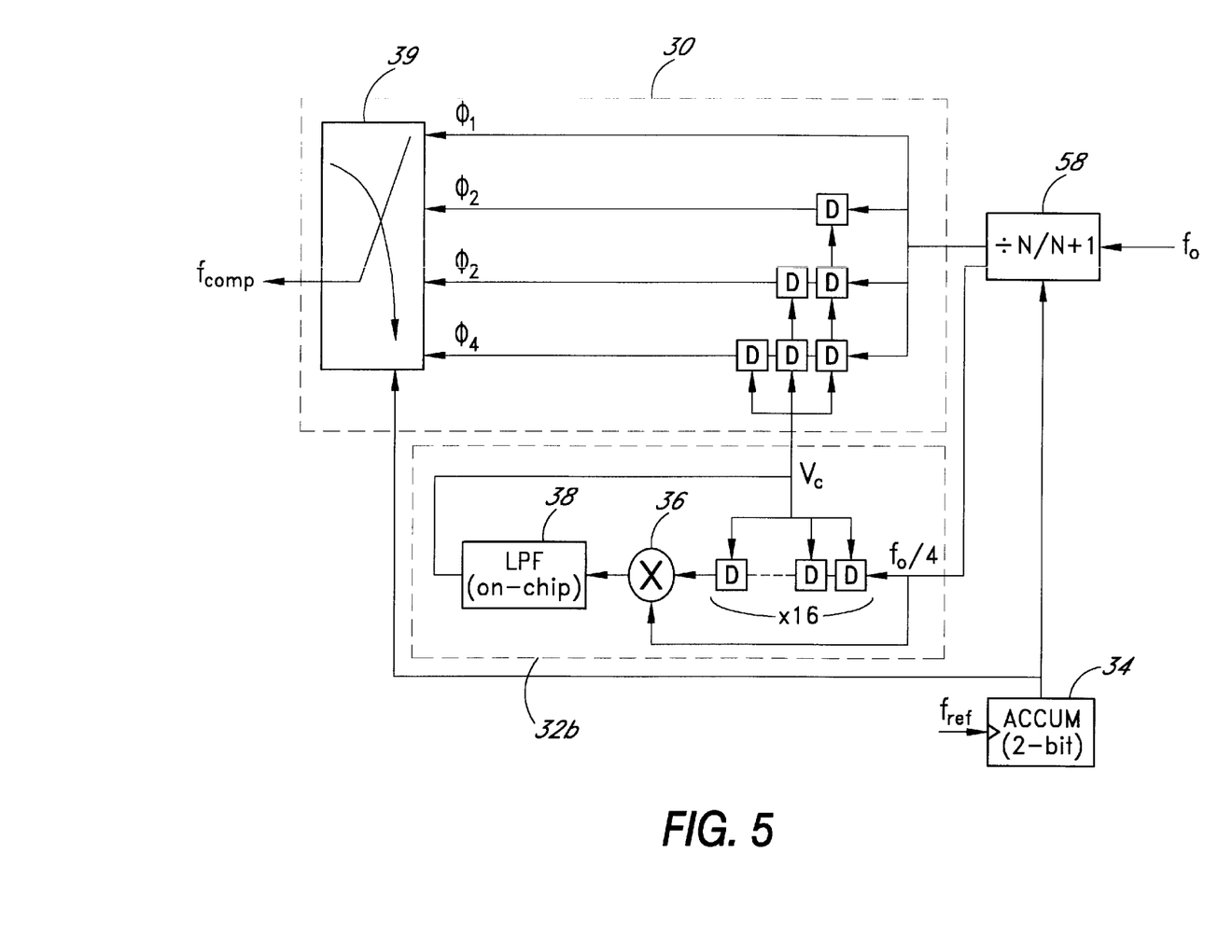
FIG. 5 is a block diagram of an alternative configuration of a portion of the synthesizer depicted in FIG. 2.

An alternative embodiment is depicted in FIG. 5. In this embodiment, a divider 58 provides an output identical to the output of the divider 28 of FIGS. 2 and 3 and a second output which is a constant divide by N output (for example, $f_o/4$). The phase compensation circuit 30 is the same arrangement as shown in FIG. 3. A will be apparent to those of ordinary skill, numerous specific signal conditioning circuits or prescalers can be employed to obtain the desired outputs from the divider 58. An example of such a divider is described in "A 1.75 GHz/3V dual modulus divide-by-128/129 prescaler in 0.7 um CMOS," J. Craninckx and M. Steyaert, IEEE Journal of Solid-State Circuits, page 890–897, July 1996.

As shown in FIG. 5, the output of the divider 58 is applied to a series of delay lines whose outputs are identified as $\phi_1-\phi_4$. $\phi_1$ has no delay elements, $\phi_2$ has a single delay element, $\phi_3$ has two delay elements, and $\phi_4$ has three delay elements. In present example, each of the delay elements (D) shown in FIG. 5, provides a signal delay of $T_{vco}/4$, where $T_{vco}$ equals the period of the frequency of the output of the VCO 26, also referred to as $f_o$. The signals $\phi_1-\phi_4$ are provided to control circuitry 39 which has an output signal $f_{comp}$, which is applied to an input of the phase detector 22 (FIG. 2). The output $f_{comp}$ of the control circuitry 39 is selectively switched among the outputs $\phi_1-\phi_4$ according to the output of the accumulator 34 which is provided to the control circuit 39.

As shown in FIG. 5, the on chip tuning circuit 32a in this embodiment includes 16 voltage control delay elements D arranged in series, a phase detector 36 and a loop filter 38. These elements are arranged as a delay locked loop. The signal $f_o/4$ from the divider 58 passes in series through the 16 delay elements of the on chip tuning circuit 32a and is then provided as an input to the phase detector 36. In addition, $f_o/4$ (not delayed) is also applied to phase detector 36. The phase detector 36 outputs a signal proportional to the difference in phase between the two input signals. The output of the phase detector 36 then passes through loop filter 38, which acts as an integrator. The output $V_c$ of the loop filter 38 is used as the control voltage for each of the delay elements D of the on chip tuning circuit 32a. In addition, the control voltage $V_c$ is also applied to each of the delay elements D in the phase compensation circuit 30. This embodiment provides a lower frequency input to the delay locked loop portion of the circuit 32a. The use of the lower frequency input to the delay locked loop can reduce power consumption.

Figure 6:
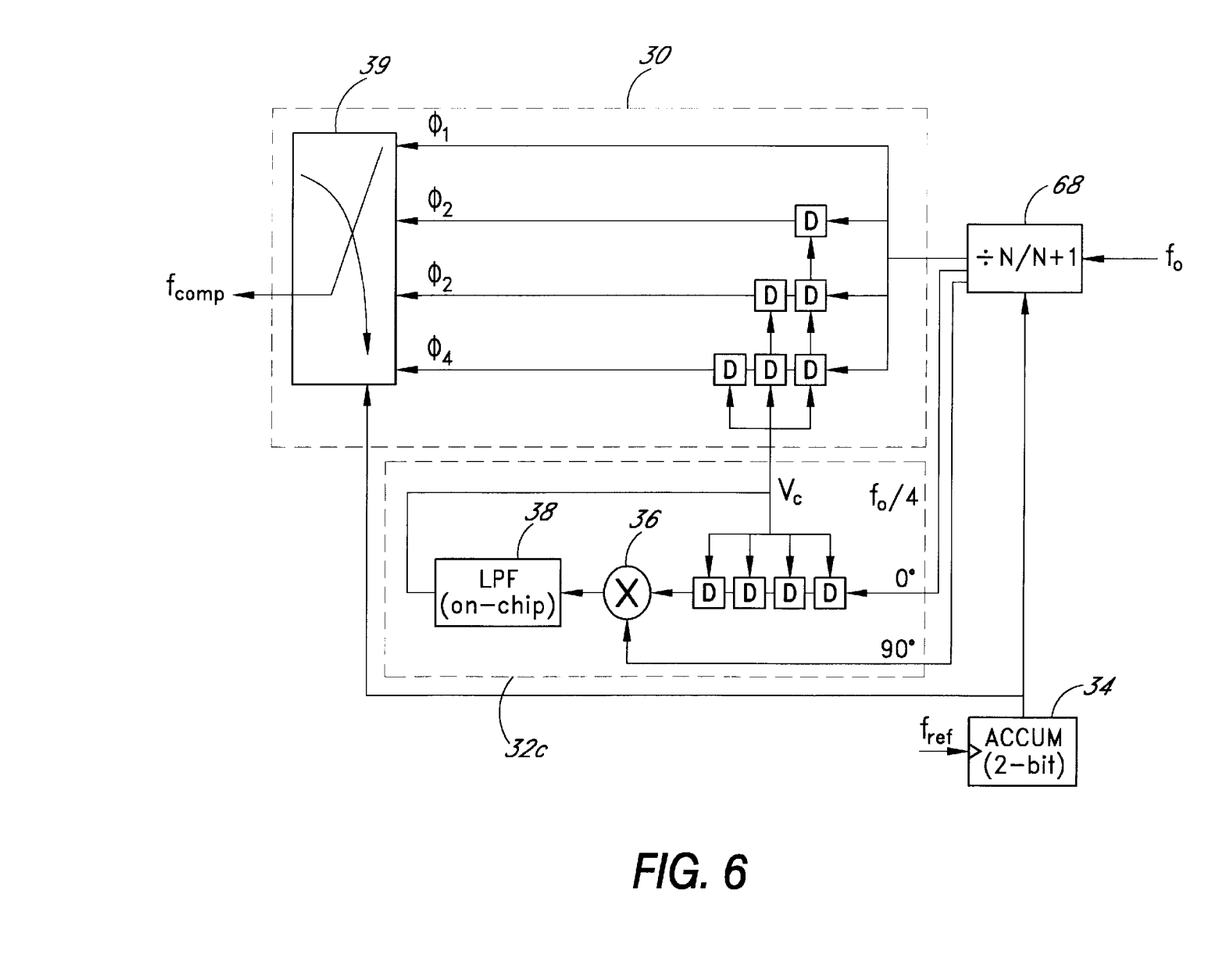
FIG. 6 is a block diagram of a second alternative configuration of a portion of the synthesizer depicted in FIG. 2.

FIG. 6 is a further embodiment of the on chip tuning circuit used in conjunction with the phase compensation circuit 30 utilizing the reduced input frequency for the delay locked loop as in FIG. 5, but also utilizing fewer delay elements. The embodiment depicted in FIG. 6 utilizes a fractional-N divider 68 which provides the same output as the divider 28 shown in FIGS. 2 and 3, a constant output divide by four ($f_o/4$) and a third output which is a constant output divide by four ($f_o/4$) which is offset by 90° from the other $f_o/4$ output. Other phase offsets such as 180° and 270° can be used with an appropriate phase detector. Again, one example of such a divider is described in the Craninckx and Steyaert article noted above. However, various other circuits known to those of ordinary skill can also be employed to generate the desired signals. As in the previous embodiments, the phase compensation circuit 30 and the on chip tuning circuit 32b are implemented using an arrangement of voltage controlled delay elements where the amount of delay is controlled by the control signal. In the present example, each of the delay elements provides a signal delay of $T_{vco}/4$, where $T_{vco}$ equals the period of the frequency of the output of the VCO 26 (see FIG. 2) also referred to as $f_o$. The output of the divider 68, which can be varied between divide by N and divide by N+1, is applied to the series of delay lines whose outputs are identified as $\phi_1-\phi_4$. $\phi_1$ has no delay elements, $\phi_2$ has a single delay element, $\phi_3$ has two delay elements, and $\phi_4$ has three delay elements. The signals $\phi_1-\phi_4$ are provided to control circuitry 39 which has an output signal $f_{comp}$ which is applied to an input of the phase detector 22 (see FIG. 2). The output $f_{comp}$ of the control circuitry 39 is selectively switched among the outputs $\phi_1-\phi_4$ according to the output of the accumulator 34 which is provided to the control circuit 39. This arrangement is the same as has been previously described with reference to FIGS. 3 and 5.

As shown in FIG. 6, the on chip tuning circuit 32b includes four voltage control delay elements D, a phase detector 36, and a loop filter 38. The foregoing element are interconnected to form a delay locked loop. The output $f_o/4$ from the divider 68 passes through the four delay elements and is then provided to the phase detector 36. The phase detector 36 outputs a signal proportional to the difference in phase between the two input signals. In addition, the signal $f_o/4$ offset by 90° from the divider 68 is also applied to phase detector 36. The output of the phase detector then is provided to the loop filter 38 which acts as an integrator. The output $V_c$ of the loop filter 38 is used as the control voltage of each of the delay elements D of the on chip tuning circuit 32C. In addition, that control voltage $V_c$ is also applied to each of the delay elements D in the phase compensation circuit 30. The foregoing configuration requires fewer delay elements than the embodiment described with reference to FIG. 5 and also consumes less power than the embodiment described with reference to FIG. 3.

Other variations within the scope of the invention, are within the scope of the invention, such as the substitution of equivalent functional circuits for circuit elements, such as the use of current based or controlled circuitry rather than voltage controlled circuitry. Similarly, various types of frequency dividers and prescalers can be employed.

The invention has been shown and described with respect to particular embodiments. However, it will be understood by those skilled in the art that various changes may be made therein without departing from the spirit and scope of the invention. For example, a current controlled oscillator may replace the VCO as the controlled oscillator. The scope of the invention is indicated by the appended claims rather than by the foregoing description. All changes which come within the meaning and range of equivalency of the claims are to be embraced within their scope.

What is claimed is:

1. A frequency synthesizer comprising:

a controlled oscillator having a variable output controlled by an input signal;

a frequency divider coupled to receive the output of said controlled oscillator and responsive to said output to provide a frequency divided output signal;

an on chip tuning circuit coupled to receive the frequency divided output of said frequency divider, said tuning circuit generating a control signal responsive to the frequency divided output of the frequency divider;

a phase compensation circuit coupled to receive the frequency divided output signal from said frequency divider, said phase compensation circuit comprising delay elements responsive to said control signal from said on chip tuning circuit, and said phase compensation circuit responsive to said frequency divided output signal to provide an output which compensates for phase lag of the frequency divided output of said frequency divider; and a phase detector coupled to receive the output of said phase compensation circuit and a reference frequency and to output a signal proportional to the difference in phase between the two inputs to control said controlled oscillator.

2. The frequency synthesizer of claim 1, wherein said divider is a fractional-N divider.

3. The frequency synthesizer of claim 2, wherein said controlled oscillator is a voltage controlled oscillator.

4. The frequency synthesizer of claim 1, further comprising a loop filter coupled to receive the output of the phase detector, said loop filter responsive to said output to generate an output signal to control said controlled oscillator.

5. A phase locked loop, comprising:

an oscillator having a variable output responsive to an input signal;

a frequency divider coupled to receive the output of said oscillator, said frequency divider producing a frequency divided output signal;

a phase compensation circuit coupled to receive the frequency divided output signal from said frequency divider, said phase compensation circuit comprising a delay means which receives the frequency divided output signal and outputs that signal delayed by a controlled amount;

a tuning circuit coupled to receive the frequency divided output and configured to generate a control signal for said delay means; and a phase detector coupled to receive the output of said phase compensation circuit and a reference frequency, said phase detector outputting a signal to said oscillator proportional to the difference in phase between the two inputs to said phase detector.

6. The phase locked loop of claim 5, further comprising a loop filter coupled to receive the output signal of said phase detector and configured to provide an output signal to said oscillator.

7. The phase locked loop of claim 5, wherein said delay means comprise voltage controlled delay cells.

8. The phase locked loop of claim 5, wherein said oscillator is a voltage controlled oscillator.

9. The phase locked loop claim 5, wherein said turning circuit further receives an offset frequency divided signal.

10. The phase locked loop of claim 5, wherein said frequency divider is a fractional-N divider.

11. The phase locked loop of claim 5, further comprising an accumulator which generates a control signal for said phase compensation circuit and said fractional-N divider.

12. A phase compensator suitable for use in a phase interpolated fractional-N frequency synthesizer having a voltage controlled oscillator having an output controlled by an input voltage, a fractional-N divider coupled to receive the output of said voltage controlled oscillator and capable of providing a frequency divided output signal, and a phase detector, the phase compensator circuit comprising:

a phase compensation circuit comprising delay elements, said phase compensation circuit configured to receive the frequency divided output from said fractional-N divider and to selectively provide a delayed output signal which compensates for the phase lag of the frequency divided output of said fractional-N divider; and a tuning circuit configured to be coupled to said fractional-N divider and said phase compensation circuit and comprising a delay locked loop configured to generate a control signal to control said delay elements.

13. The phase compensator of claim 12, wherein each delay element provides an output signal of a different delay, and further comprising control circuitry which receives the outputs of each of said plurality of delays and selectively outputs said delayed signals.

14. An improved method for synthesizing a frequency using a phase locked loop comprising:

generating an output signal;

frequency dividing the output signal by at least two integer values to generate a fractional-N divided signal over a discreet time period; and generating a variably delayed signal based upon the fractional-N divided signal, wherein said variable delay compensates for phase delays of said fractional-N divided signal within said discreet time period.

15. The method of claim 14, further comprising comparing the phase of the variably delayed signal and a reference signal and varying the output signal according to that difference.

* * * * *

UNITED STATES PATENT AND TRADEMARK OFFICE
CERTIFICATE OF CORRECTION

PATENT NO. : 6,064,272
DATED : May 16, 2000
INVENTOR(S) : Woogeun Rhee

It is certified that error appears in the above-identified patent and that said Letters Patent is hereby corrected as shown below:

In the figure on the Title page, in the block labeled 32, delete "On-chip luning" and insert --On-chip tuning--.

Sheet 3 of 7, Figure 2, in the block labeled 32, delete "On-chip luning" and insert --On-chip tuning--.

Signed and Sealed this

Twenty-fourth Day of April, 2001

Attest:

NICHOLAS P. GODICI

Attesting Officer     Acting Director of the United States Patent and Trademark Office